United States Patent [19]

Mahmood

[11] Patent Number: 5,473,263
[45] Date of Patent: Dec. 5, 1995

[54] NEGATIVE FEEDBACK TO REDUCE VOLTAGE OSCILLATION IN CMOS OUTPUT BUFFERS

[75] Inventor: Qazi Mahmood, San Jose, Calif.

[73] Assignee: Advanced Micro Devices, Inc., Sunnyvale, Calif.

[21] Appl. No.: 359,235

[22] Filed: Dec. 19, 1994

[51] Int. Cl.⁶ .................................................. H03K 17/16
[52] U.S. Cl. ............................ 326/27; 326/121; 327/380
[58] Field of Search ...................... 326/27, 121; 327/380, 327/381

[56] References Cited

U.S. PATENT DOCUMENTS

| | | | |
|---|---|---|---|
| 4,973,861 | 11/1990 | Dikken | 326/27 |
| 5,028,817 | 7/1991 | Patil | 326/27 |
| 5,153,457 | 10/1992 | Martin | 326/27 |
| 5,248,906 | 7/1993 | Mahmood | 326/27 |
| 5,248,907 | 9/1993 | Lin | 326/27 |
| 5,315,187 | 5/1994 | Cheng | 326/27 |

*Primary Examiner*—Edward P. Westin
*Assistant Examiner*—Andrew Sanders
*Attorney, Agent, or Firm*—Davis Chin

[57] ABSTRACT

A CMOS output buffer circuit includes negative feedback means for significantly reducing voltage oscillation. The buffer circuit is comprised of a pull-up transistor (P1), a pull-down transistor (N1), a first reference voltage generator circuit (44), a second reference voltage generator circuit (54), a first negative feedback circuit (48), and a second negative feedback circuit (58). First and second negative feedback circuits are coupled between the internal power supply potential/ground potential nodes and the gates of the pull-up/pull-down driver transistors so as to reduce the rate of change of the transient charging/discharging currents, respectively.

17 Claims, 3 Drawing Sheets

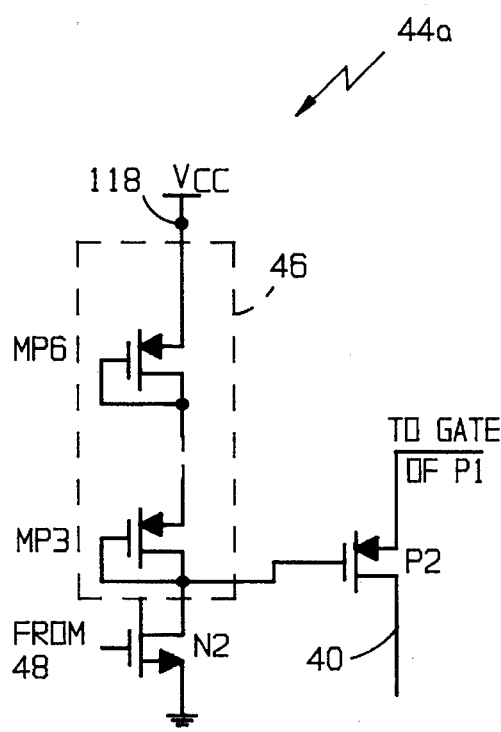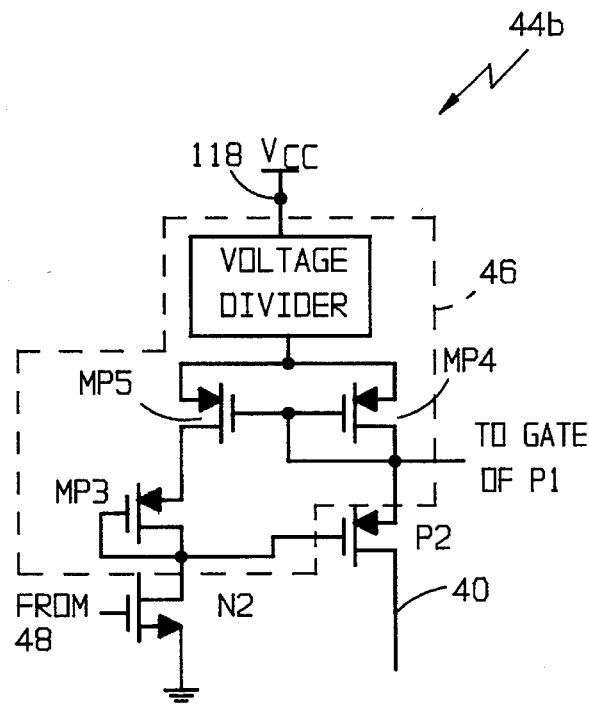
FIG. 5(a)   FIG. 5(b)
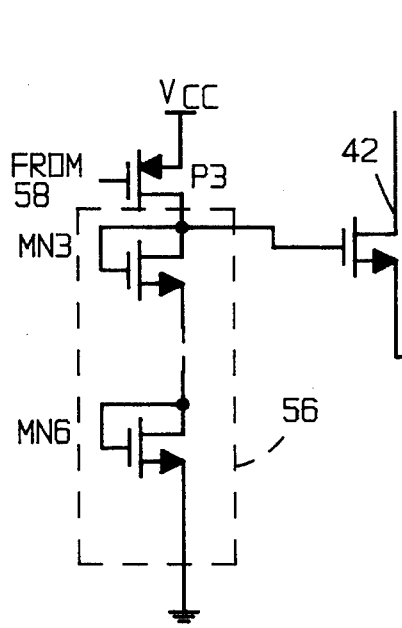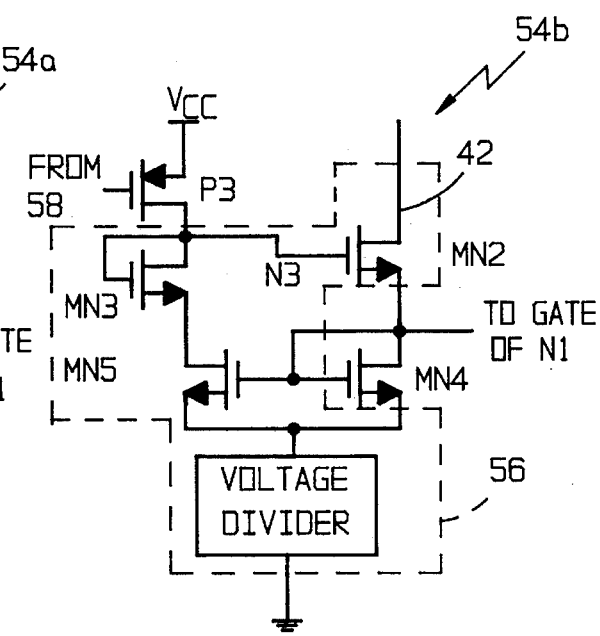
FIG. 6(a)   FIG. 6(b)

NEGATIVE FEEDBACK TO REDUCE VOLTAGE OSCILLATION IN CMOS OUTPUT BUFFERS

BACKGROUND OF THE INVENTION

1. Field of the Invention

This invention relates generally to high-speed, high-drive output buffer circuits and more particularly, it relates to CMOS output buffer circuits which includes negative feedback means for significantly reducing voltage oscillation.

2. Description of the Prior Art

As is well-know in the art, digital logic circuits are widely used in the areas of electronics and computer-type equipment. Specifically, one such use of digital logic circuits is to provide an interface function between one logic type of a first integrated circuit device and another logic type of a second integrated circuit device. An output buffer circuit is an important component for this interface function. The output buffer circuit provides, when enabled, an output signal which is a function of a data input signal received from other logic circuitry of the integrated circuit.

In FIG. 1, there is shown a simplified schematic circuit diagram of a portion of a typical output buffer 10 which is formed as a part of a semiconductor integrated circuit chip 12. The output buffer circuit 10 includes a pull-up transistor device 14 and a pull-down transistor device 16 connected in series between respective first and second power supply pads 18, 20. The first power supply pad 18 may be supplied with a positive potential or voltage VCC (typically at +5.0 volts) which is connected to an internal power supply potential node VL2 via a lead line having parasitic inductance L2. The source of the P-channel field-effect transistor 14 is also connected to the node VL2. The parasitic inductance L2 represents a package inductance associated with the pad 18 itself and the bond wire used to connect the source of the transistor 14 to the pad 18. The second power supply pad 20 may be supplied with a ground potential VSS (typically at 0 volts) which is connected to an internal ground potential node VL1 via lead line having parasitic inductance L1. A source of the N-channel field-effect transistor 16 is also connected to the node VL1. The parasitic inductance L1 represents a package inductance associated with the pad 20 itself and the bond wire used to connect the source of the transistor 16 to the pad 20.

The drains of the transistors 14 and 16 are connected together and are further joined to an internal node 22. The internal node 22 is also connected to an output pad 24 via a lead connection having parasitic inductance L3. The parasitic inductance L3 represents a package inductance associated with the output pad 24 itself and the bond wire used to connect the drains of the transistors 14, 16 to the pad 24. The output of the pad 24 of the buffer circuit 10 is used to drive a capacitive load represented by capacitor CAP and connected between the pad 24 and the ground potential VSS. The capacitor CAP defines the load that the output pad sees and is the sum of the individual capacitances of all the devices being driven as well as the board capacitance.

The control circuitry 26 has a first input on line 28 for receiving a data input signal DATAIN and a second input on line 30 for receiving an enable signal ENABLE. The control circuitry 26 has a first control signal ENUP on line 32 connected to the gate of the P-channel pull-up transistor 14 and a second control signal ENDN on line 34 connected to the gate of the N-channel pull-down transistor 16.

Dependent upon the logic state of the data input signal and the enable signal, either the pull-up transistor 14 or the pull-down transistor 16 is quickly turned off and the other one of them is turned on. Such rapid switching off and on of the pull-up and pull-down transistor devices causes sudden surges of current creating what is commonly known as current spikes. As a result, when the internal node 22 is making a high-to-low transition, oscillation or inductive ringing appears at the output pad 24 referred to as "ground bounce." This "ground bounce" is defined to be undershooting of the ground potential followed by a dampening oscillation around it. This is a major problem in high-speed output buffer circuits. The higher the value of the inductance and the lower the value of the capacitance, the more severe will be the "ground bounce."

Similarly, when the internal output node 22 is making a low-to-high transition, oscillation or inductive ringing will appear at the output pad 24 which will overshoot the positive supply potential. This overshoot is sometimes referred to as "supply bounce."

Also, during such output switching, charging and discharging currents from the pull-up and pull-down transistor devices will flow through the package inductances of the power supply and ground lines so as to cause inductive noise at the internal power supply potential node VL2 and at the internal ground potential node VL1. These internal supply and ground noises are undesirable since they will degrade the output voltage levels (logic "1" and logic "0") causing interface problems among the output buffer circuit and other integrated circuits.

Various approaches have been made in the prior art of output buffer design to minimize the undesired ground bounce and the supply and ground noises without sacrificing the needed high-speed of operation. One technique is described and illustrated in U.S. Pat. No. 4,877,980 issued on Oct. 31, 1989, and entitled "Time Variant Drive Circuit For High Speed Bus Driver To Limit Oscillation Or Ringing On A Bus." This '980 patent discloses a drive circuit which modifies a digital drive signal to produce a time variant drive signal for application to a gate of a bus driver transistor in order to reduce the amplitude of ringing on a bus. The drive circuit includes a P-channel MOS transistor and an N-channel MOS transistor which are connected so that the digital drive signal is simultaneously applied to the source of the P-channel transistor and to the drain of the N-channel transistor. The gate of the bus driver transistor is connected to the drain of the P-channel transistor and to the source of the N-channel transistor. A bias voltage is applied to one of the gates of the P-channel and N-channel transistors so that application of the digital drive signal to the drive circuit will cause the N-channel transistor to rapidly apply a limited drive signal to the gate of the driver transistor and will cause the P-channel transistor to apply a gradually increasing drive signal to the gate of the driver transistor, thereby preventing objectionable ringing on the bus.

A second technique is described and shown in U.S. Pat. No. 5,321,319 issued on Jun. 14, 1994, and entitled "High Speed CMOS Bus Driver Circuit That Provides Minimum Output Signal Oscillation." This '319 patent discloses a high speed bus driver circuit which includes first and second drive transistors and first and second reference voltage generators coupled to the respective first and second drive transistors. The reference voltage generators serve to provide clamping voltages at certain threshold levels at the gates of the first and second drive transistors and to provide propagation delay for driving up and down signals, respectively. In FIGS. 3(a) and 3(b), the reference generators are formed by voltage divider comprised of a load transistor and a plurality of saturated series driver transistors. In the alternate embodiment of FIGS. 4(a) and 4(b), the reference generators have been modified slightly from the ones in FIGS. 3(a) and 3(b) so as to convert the same into a current mirror configuration. As a result, there is provided a controlled slew rate and a clamp voltage on the gates of the bus drive transistor so as to minimize the voltage oscillation on the bus.

Further, a third technique is depicted in U.S. Pat. No. 5,248,906 issued on Sep. 28, 1993, and entitled "High Speed CMOS Output Buffer Circuit Minimizes Output Signal Oscillation and Steady State Current." This '906 patent teaches a high speed output buffer for minimizing output signal oscillation and steady state current which includes first and second driver transistors, a pair of reference voltage generators, means for providing a controlled ramping of the output voltage, and means for shutting down the pair of reference generators after the output oscillation has subsided to some acceptable level. In FIGS. 3(a) and 3(b), the reference generators illustrated are similar to those shown in FIGS. 4(b) and 4(a) of the '319 patent.

It will be noted that the above-described '980, '319, and '906 patents are all assigned to the same assignee as the present invention and are hereby incorporated by reference. The present invention represents a significant improvement over these aforementioned patents so as to further minimize the voltage oscillation on the bus. This is achieved by the provision of negative feedback means coupled between the internal power supply potential/ground potential node and the gate of the pull-up/pull-down drive transistor.

SUMMARY OF THE INVENTION

Accordingly, it is a general object of the present invention to provide a CMOS output buffer circuit with significantly reduced voltage oscillation which is relatively simple and economical to manufacture and assemble, but yet overcomes the disadvantages of the prior art output buffer circuits.

It is an object of the present invention to provide a CMOS output buffer circuit which has a significant reduction in voltage oscillation.

It is another object of the present invention to provide a CMOS output buffer circuit which includes a supply bounce sensing circuit associated with the pull-up transistor and a ground bounce sensing circuit associated with the pull-down transistor.

It is still another object of the present invention to provide a CMOS output buffer circuit which includes first negative feedback means for slowing down the slew rate of the voltage at the gate of the pull-up transistor and second negative feedback means for slowing down the slew rate of the voltage at the gate of the pull-down transistor.

In accordance with these aims and objectives, the present invention is concerned with the provision of a CMOS output buffer circuit for providing an output signal at an output node which has significantly reduced voltage oscillation. The output buffer circuit includes a pull-up transistor, a pull-down transistor, a first reference voltage generator circuit, a second reference voltage generator circuit, a first negative feedback circuit, and a second negative feedback circuit. The pull-up transistor has one of its main electrodes connected to a power supply potential node and its other one of its main electrodes connected to the output node. The gate electrode of the pull-up transistor is connected to receive a first control signal for generating a transition from a low logic level to a high logic level at the output node. The pull-down transistor has one of its main electrodes connected to the output node and its other one of its main electrodes connected to a ground potential node. The gate electrode of the pull-down transistor is connected to receive a second control signal for generating a transition from the high logic level to the low logic level at the output node.

The first reference voltage generator circuit includes a first load transistor for generating a first clamp voltage to the gate of the pull-up transistor. The second reference voltage circuit includes a second load transistor for generating a second clamp voltage to the gate of the pull-down transistor. The first negative feedback circuit is responsive to voltage oscillation generated at the power supply potential node for generating a first negative feedback signal to the gate of the first load transistor to slow down the slew rate of the voltage at the gate of the pull-up transistor during the low-to-high transition thereby significantly reducing the voltage oscillation at the power supply potential node. The second negative feedback circuit is responsive to voltage oscillation generated at the ground potential node for generating a second feedback signal to the gate of the second load transistor to slow down the slew rate of the voltage at the gate of the pull-down transistor during the high-to-low transition thereby significantly reducing the voltage oscillation at the ground potential node.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 5(a) shows a first embodiment of the first reference voltage generator circuit of FIG. 2;

FIG. 5(b) shows a second embodiment of the first reference voltage generator circuit of FIG. 2;

FIG. 6(a) shows a first embodiment of the second reference voltage generator circuit of FIG. 2;

FIG. 6(b) shows a second embodiment of the second reference voltage generator circuit of FIG. 2;

DESCRIPTION OF THE PREFERRED EMBODIMENTS

Figure 2:
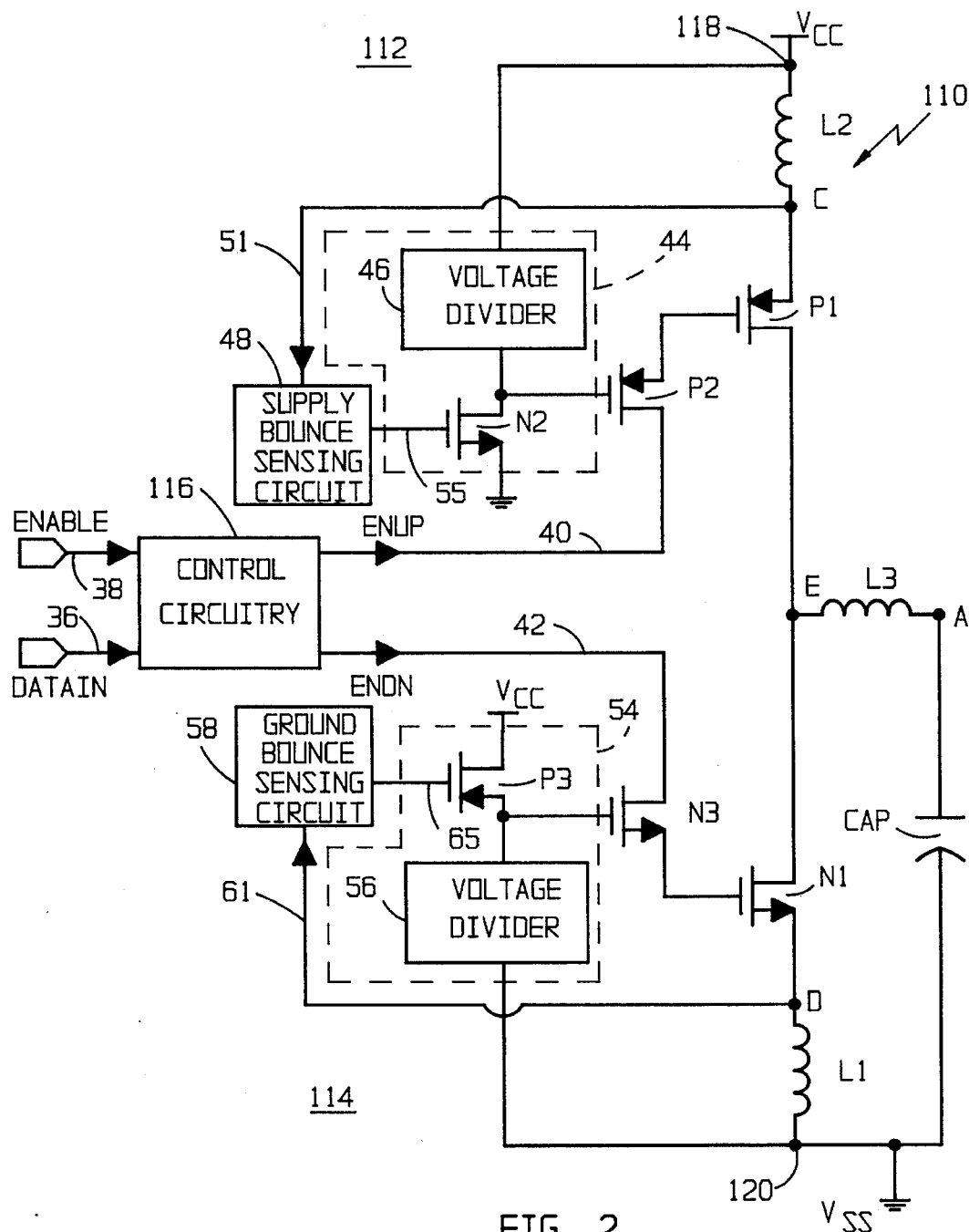
FIG. 2 is a schematic circuit diagram of a CMOS output buffer circuit, constructed in accordance with the principles of the present invention.

Referring now in detail to the drawings, there is shown in FIG. 2 a schematic circuit diagram of a CMOS output buffer circuit 110 which is constructed in accordance with the principles of the present invention. The CMOS output buffer circuit 110 is formed of a large bus driving, P-channel MOS pull-up transistor P1 and a large bus driving, N-channel MOS pull-down transistor N1. The buffer circuit 110 provides the capability of driving quickly output capacitive loads but yet minimizes the voltage oscillation on the bus due to the pull-up and pull-down transistors P1 and N1 switching states. The output buffer circuit 110 is comprised of a pull-up circuit 112, a pull-down circuit 114, and control circuitry 116.

In the pull-up circuit 112, the source of the pull-up transistor P1 is connected to an internal power supply potential node C which is coupled to a first power supply node 118 via a lead line having package inductance L2. The first power supply node 118 may be supplied with a positive potential or voltage VCC which is typically at +5.0 volts. In the pull-down circuit 114, the source of the pull-down transistor N1 is connected to an internal ground potential node D which is coupled to a second power supply node 120 via a lead line having a package inductance L1. The second power supply node 120 may be supplied with a ground potential VSS which is typically at 0 volts. The drains of the transistors P1 and N1 are connected together and to an internal output node E which is coupled to an output node A via a lead line having package inductance L3. Further, a capacitive load represented by a capacitor CAP is connected between the output node A and the ground potential VSS.

The control circuitry 116 has a first input on line 36 for receiving a data input signal DATAIN and a second input on line 38 for receiving an enable signal ENABLE. The control circuitry 116 generates a first control signal ENUP on line 40 which is used to control the pull-up circuit 112 and a second control signal ENDN on line 42 which is used to control the pull-down circuit 114. The output buffer circuit 110 provides an output signal at the output node A in response to a data input signal received on the line 36.

The pull-up circuit 112 also includes a P-channel source following transistor P2 whose source is connected to the gate of the pull-up transistor P1 and whose drain is connected to receive the first control signal ENUP. The gate of the transistor P2 is connected to a first voltage reference generator circuit 44. The voltage generator circuit 44 is formed of an N-channel transistor N2 serving as a load and a voltage divider circuit 46. One end of the voltage divider circuit 46 is connected to the supply potential VCC and the other end thereof is connected to the drain of the load transistor N2 and to the gate of the source following transistor P2.

A schematic diagram of a first embodiment of the voltage reference generator circuit 44a is shown in FIG. 5(a). The reference voltage generator circuit 44a includes the load transistor N2 and a series of saturated P-channel transistors MP3 . . . MP6. A schematic circuit diagram of a second embodiment of the voltage reference generator circuit 44b is shown in FIG. 5(b). The reference voltage circuit 44b is substantially the same as shown in FIG. 5(a), except that a current mirror transistor MP4 has been added so as to convert it into a current mirror configuration. It will be noted that the voltage reference generator circuits 44a and 44b are quite similar to those shown in FIG. 3B and FIG. 4B of the above-referenced '319 patent. However, in FIG. 3B and 4B of the prior art patent, the gate of the load transistor N2 is tied to a ground potential which causes the load transistor to act like a passive load device. Unlike this prior art patent, the gate of the load transistor N2 in FIGS. 5(a) and 5(b) of the present invention is now tied to the output of the supply bounce sensing circuit 48 which causes the load transistor N2 to function as an active load device.

In order to significantly reduce or eliminate the supply bounce when the internal output node E makes a low-to-high transition, there is provided a supply bounce sensing circuit 48 which slows down the slew rate of the gate-to-source voltage at the gate of the pull-up transistor P1 so as to reduce the rate of change of its transient charging current, thereby reducing the voltage oscillation on the internal power supply potential node C. In the preferred embodiment of FIG. 3 of the invention, the supply bounce sensing circuit 48 is comprised of a negative half-wave rectifier circuit 50 and a voltage amplifier circuit 52. The sensing circuit 48 defining negative feedback means provides negative feedback of the voltage at the internal power supply potential node C to the gate of the pull-up transistor P1. As can be seen, the input of the negative half-wave rectifier circuit 50 on line 51 is connected to the internal power supply potential node C, which is tied to the source electrode of the pull-up transistor P1 and is likely to experience the worst effect of the supply bounce. The output of the half-wave rectifier circuit 50 in line 53 is connected to the input of the voltage amplifier circuit 52. The output of the voltage amplifier circuit on line 55 is connected to the gate or control electrode of the load transistor N2.

Figure 1:
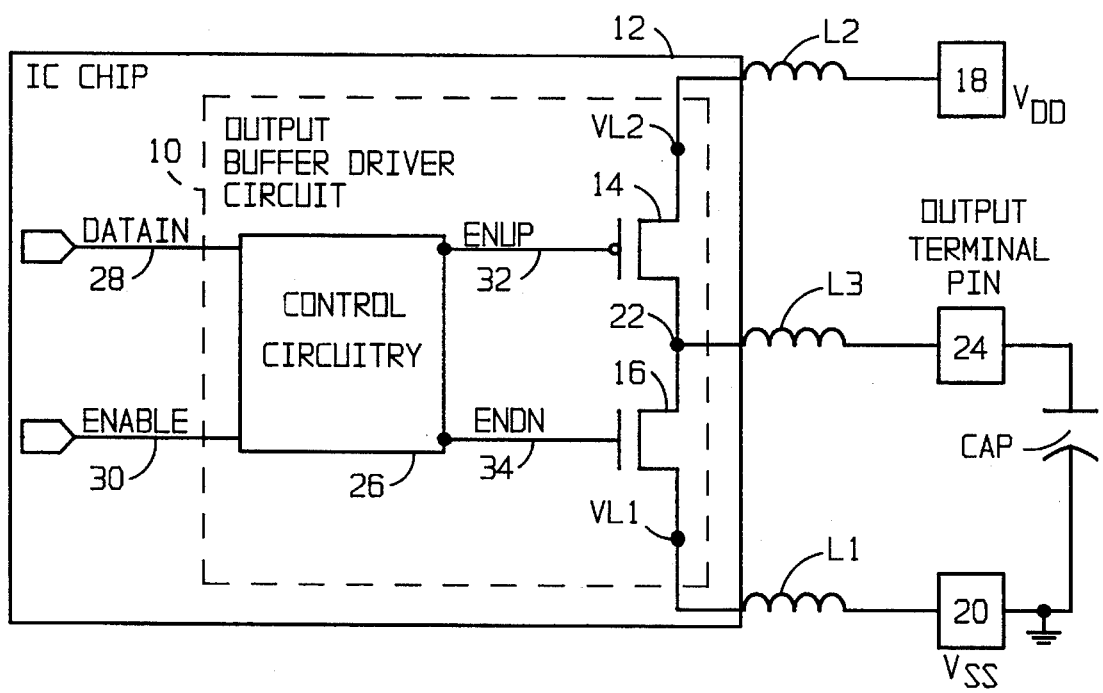
FIG. 1 is a simplified block diagram of a prior art output buffer circuit utilizing a P-channel pull-up transistor and an N-channel pull-down transistor.
Figure 7A:
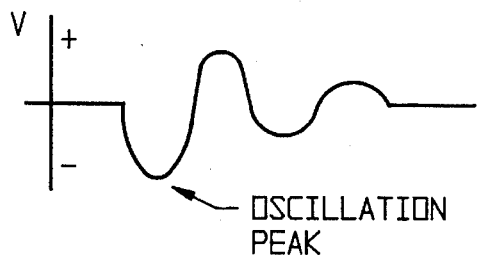
FIGS. 7(a) and 7(b) illustrate the oscillation voltage waveforms at the respective input and output of the negative half-wave rectifier of FIG. 3.
Figure 7B:
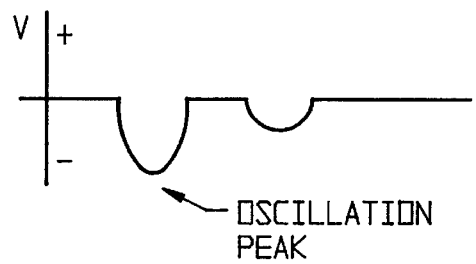

The negative half-wave rectifier circuit 50 is preferably formed of a diode and operatively connected so as to clip off the positive portion of the supply oscillation voltage, which is depicted in FIG. 7(a). The output of the rectifier circuit 50 is shown in FIG. 7(b) and is fed to the input of the voltage amplifier circuit 52 so as to amplify the oscillating signal to a desired level dependent upon the amount of negative feedback required. It should be understood to those skilled in the art that the voltage amplifier circuit may be eliminated entirely when the desired amount of negative feedback can be achieved without any such amplification. In addition, if the amount of negative feedback is too large it should be apparent that the voltage amplifier circuit can be replaced with an attenuator circuit. This oscillating signal from the voltage amplifier circuit 55 is then fed directly to the gate of the load transistor N2. Since the oscillating signal has only negative polarity, it will act to provide negative feedback to the load transistor N2 so as to decrease its gate drive. Accordingly, the amount of decrease in the gate drive will be proportional to the amount of supply bounce experienced on the internal power supply potential node C.

Similarly, the pull-down circuit 114 also includes an N-channel source following transistor N3 whose source is connected to the gate of the pull-down transistor N1 and whose drain is connected to receive the second control signal ENDN on the line 42. The gate of the transistor N3 is connected to a second voltage reference generator circuit 54. The voltage reference generator circuit 54 is formed of a P-channel transistor P3 serving as a load and a voltage divider circuit 56. One end of the voltage divider circuit 56 is connected to a ground potential VSS, and the other end thereof is connected to the source of the load transistor P3 and to the gate of the source following transistor N3.

A schematic circuit diagram of a first embodiment of the second voltage reference generator circuit 54a is shown in FIG. 6(a). The second voltage reference generator circuit 54a includes the load transistor P2 and a series of saturated N-channel transistors MN3 . . . MN6. A schematic circuit diagram of a second embodiment of the second voltage reference generator circuit 54b is shown in FIG. 6(b). The generator circuit 54b is substantially the same as shown in FIG. 6(a), except that a current mirror transistor MN4 has been added so as to convert it into a current mirror configuration. It will be noted that the voltage reference generator circuits 54a and 54b are again quite similar to those shown in FIGS. 3A and 4A of the above-referenced '319 patent. However, in FIGS. 3A and 4A of the prior art patent, the gate of the load transistor P3 is tied to a ground potential which causes the load transistor to act like a passive load device. Unlike this prior art patent, a gate of the load transistor P3 in FIGS. 6(a) and 6(b) of the present invention is now tied to the output of the ground bounce sensing circuit 58 which causes the load transistor P3 to function as an active load device.

Figures 3, 4:
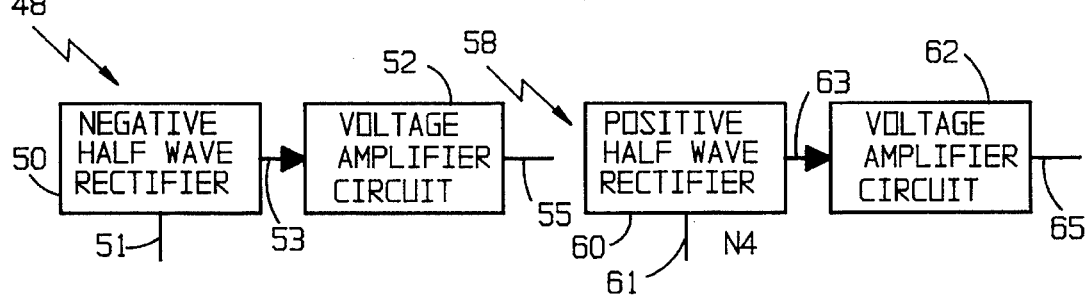
FIG. 3 is a block diagram of the supply bounce sensing circuit of FIG. 2.
FIG. 4 is a block diagram of the ground bounce sensing circuit of FIG. 2.

In order to significantly reduce or eliminate the ground bounce when the internal output node E makes a high-to-low transition, there is provided a ground bounce sensing circuit 58 which slows down the slew rate of the gate-to-source voltage at the gate of the pull-down transistor N1 so as to reduce the rate of change of its transient discharging current, thereby reducing the voltage oscillation on the internal ground potential node D. In FIG. 4 of the preferred embodiment of the invention, the ground bounce sensing circuit 58 is comprised of a positive half-wave rectifier circuit 60 and a voltage amplifier circuit 62. The ground bounce sensing circuit defining negative feedback means provides negative feedback of the voltage at the internal ground potential node D to the gate of the pull-down transistor N1. As can be seen, the input of the positive half-wave rectifier circuit 60 on line 61 is connected to the internal ground potential node D which is tied to the source electrode of the pull-down transistor N1 and is likely to experience the worst effect of the ground bounce. The output of the rectifier circuit 60 on line 63 is connected to the input of the voltage amplifier circuit 62. The output of the voltage amplifier circuit 62 on the line 65 is connected to the gate or control electrode of the load transistor P3.

Figure 8A:
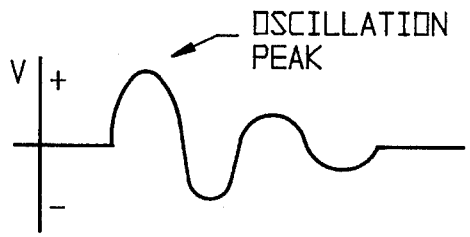
FIGS. 8(a) and 8(b) illustrate the oscillation voltage waveforms at the respective input and output of the positive half-wave rectifier of FIG. 4.
Figure 8B:
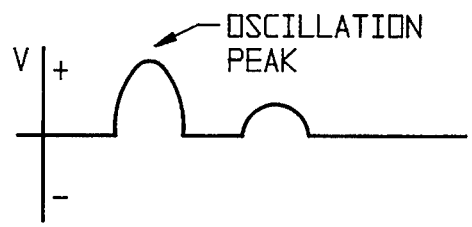

The positive half-wave rectifier circuit 60 is preferably formed of a diode and operatively connected so as to clip off the negative portion of the ground oscillation voltage, which is depicted in FIG. 8(a). The output of the rectifier circuit 60 is shown in FIG. 8(b) and is fed to the input of the voltage amplifier circuit 62 so as to amplify the oscillating signal to a desire level dependent upon the amount of negative feedback required. Again, it will be noted that this voltage amplifier circuit 62 may be eliminated entirely when the desired amount of negative feedback can be achieved without any amplification. This oscillating signal from the voltage amplifier circuit 62 is then fed directly to the gate of the load transistor P3 via the line 65. Since the oscillating signal has only positive polarity, it will act to provide negative feedback to the load transistor P3 so as to decrease its gate drive. Accordingly, the amount of decrease in the gate drive will be proportional to the amount of ground bounce experienced on the internal ground potential node D.

In order to provide an understanding of the operation of the CMOS output buffer circuit 110 of the present invention, the pull-down action will now be explained. Initially, it will be assumed that the data input signal DATAIN is at a high or logic "1" level and that the enable signal ENABLE is also high and the output node A is at a high level. Further, it will be assumed that the first control signal ENUP on the line 40 is low so as to turn on the pull-up transistor P1 and that the second control signal ENDN on line 42 is low so as to turn off the pull-down transistor N1.

When the data input signal DATAIN makes a high-to-low transition, the first control signal will go high so as to quickly turn off a pull-up transistor P1. Shortly thereafter, the second control signal will also go high so as to turn on a pull-down transistor N1. As a result, the instantaneous pull-down current (the oscillating signal of FIG. 8(a)) will be generated at the internal ground potential node D. Due to the positive rectifier circuit 60 of the ground bounce sensing circuit 58, only the positive oscillation voltage (FIG. 8b) will be applied to the gate of the load transistor P3 in the second reference voltage generator circuit 54. When the ground bounce amplitude of the oscillating signal reaches its peak, the gate-to-source voltage applied to the gate of the load transistor P3 will be at its minimum. Thus, this causes the load transistor P3 to become weak in its conduction which lowers the voltage at the gate of the source following transistor N3. Consequently, the source following transistor N3 will also become weak in its conduction so as to slow down the slew rate of the gate-to-source voltage at the gate of the large bus, pull-down transistor N1. This slower and more controlled ramping of the gate-to-source voltage will reduce the rate of change of the transient discharging current in the pull-down transistor N1, thereby reducing the voltage oscillation on its internal ground potential node D.

As the oscillating signal on the internal ground potential node D decays more and more, the load transistor P3 will regain its larger gate drive. Further, when the oscillating signal has completely subsided, the gate-to-source voltage on the gate of the load transistor P3 will be at its maximum. As a result, the reference voltage generator circuit 54 will then be allowed to provide a clamping voltage on the gate of the pull-down transistor N1, thereby facilitating further prevention of any additional voltage oscillation on the internal ground potential node D.

In order to effect a pull-up action, the pull-down transistor N1 is quickly turned off and the pull-up transistor P1 is then turned on. Similarly, the negative half-wave rectifier circuit 50 of the supply bounce sensing circuit 48 will sense the instantaneous pull-up current (the oscillating signal of FIG. 7(a)) generated at the internal power supply potential node C and cause only the negative oscillating voltage (FIG. 7b) to be applied to the gate of the load transistor N2 in the first reference voltage generator circuit 44. Again, the gate drives of the load transistor N2 and the source following transistor P2 will be reduced so as to slow down the slew rate of the gate-to-source voltage at the gate of the large bus-driving, pull-up transistor P1, thereby reducing the voltage oscillation on the internal power supply potential node C.

From the foregoing detailed description, it can thus be seen that the present invention provides a CMOS output buffer circuit for providing an output signal at an output node which has significantly reduced voltage oscillation. The output buffer circuit of the present invention includes a pull-up transistor, a pull-down transistor, a first reference voltage generator circuit, a second reference voltage generator circuit, a first negative feedback circuit, and a second negative feedback circuit. The first and second negative feedback circuits are coupled between the internal power supply potential/ground potential nodes, and the gates of the pull-up/pull-down driving transistors in order to reduce the rate of change of the transient charging/discharging currents, respectively.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A CMOS output buffer circuit for providing an output signal at an output node which has significantly reduced voltage oscillation, comprising:

a pull-up transistor (P1) having one of its main electrodes connected to a power supply potential node and its other one of its main electrodes connected to the output node, said pull-up transistor having its gate electrode connected to receive a first control signal for generating a transition from a low logic level to a high logic level at the output node;

a pull-down transistor (N1) having one of its main electrodes connected to the output node and the other one of its main electrodes connected to a ground potential node, said pull-down transistor having its gate electrode connected to receive a second control signal for generating a transition from the high logic level to the low logic level at the output node;

first reference voltage generator means (44) including a first load transistor (N2) for generating a first clamp voltage to the gate of said pull-up transistor;

second reference voltage generator means (54) including a second load transistor (P3) for generating a second clamp voltage to the gate of said pull-down transistor;

first negative feedback means (48) responsive to voltage oscillation generated at the power supply potential node for generating a first negative feedback signal to the gate of said first load transistor to slow down the slew rate of the voltage at the gate of said pull-up transistor during the low-to-high transition, thereby reducing significantly the voltage oscillation at the power supply potential node; and second negative feedback means (58) responsive to voltage oscillation generated at the ground potential node for generating a second negative feedback signal to the gate of said second load transistor to slow down the slew rate of the voltage at the gate of said pull-down transistor during the high-to-low transition, thereby reducing significantly the voltage oscillation at the ground potential node.

2. A CMOS output buffer circuit as claimed in claim 1, wherein said pull-up transistor is a P-channel MOS transistor.

3. A CMOS output buffer circuit as claimed in claim 2, wherein said pull-down transistor is an N-channel MOS transistor.

4. A CMOS output buffer circuit as claimed in claim 1, wherein said first reference voltage generator means (44) includes a first voltage divider circuit (46) having its one end connected to a power supply potential and its other end connected to the first load transistor (N2).

5. A CMOS output buffer circuit as claimed in claim 4, wherein said second reference voltage generator means (54) includes a second voltage divider circuit (56) having its one end connected to a ground potential and its other end connected to the second load transistor (P3).

6. A CMOS output buffer circuit as claimed in claim 4, wherein said first reference voltage generator means (44) is coupled in a current mirror configuration.

7. A CMOS output buffer circuit as claimed in claim 5, wherein said second reference voltage generator means (54) is coupled in a current mirror configuration.

8. A CMOS output buffer circuit as claimed in claim 1, wherein said first negative feedback means (48) is comprised of supply bounce sensing circuit which is formed of a negative half-wave rectifier circuit (50) and a first voltage amplifier circuit (52), said negative rectifier circuit having its input connected to the internal power supply node and an output, said voltage amplifier circuit having its input connected to the output of said negative rectifier circuit and its output connected to the gate of said first load transistor (N2).

9. A CMOS output buffer circuit as claimed in claim 8, wherein said second negative feedback means (58) is comprised of a ground bounce sensing circuit which is formed of a positive half-wave rectifier circuit (60) and a second voltage amplifier circuit (62), said positive rectifier circuit (60) having its input connected to the ground potential node and an output, said second voltage amplifier circuit having its input connected to the output of said positive rectifier circuit and its output connected to the gate of said second load transistor (P3).

10. A CMOS output buffer circuit for providing an output signal at an output node which has significantly reduced voltage oscillation, comprising:

a pull-up transistor (P1) having one of its main electrodes connected to a power supply potential node and its other one of its main electrodes connected to the output node, said pull-up transistor having its gate electrode connected to receive a first control signal for generating a transition from a low logic level to a high logic level at the output node;

a pull-down transistor (N1) having one of its main electrodes connected to the output node and the other one of its main electrodes connected to a ground potential node, said pull-down transistor having its gate electrode connected to receive a second control signal for generating a transition from the high logic level to the low logic level at the output node;

reference voltage generator means (54) including a load transistor (P3) for generating a clamp voltage to the gate of said pull-down transistor; and negative feedback means (58) responsive to voltage oscillation generated at the ground potential node for generating a negative feedback signal to the gate of said load transistor to slow down the slew rate of the voltage at the gate of said pull-down transistor during the high-to-low transition, thereby reducing significantly the voltage oscillation at the ground potential node.

11. A CMOS output buffer circuit as claimed in claim 10, wherein said pull-up transistor is a P-channel MOS transistor.

12. A CMOS output buffer circuit as claimed in claim 11, wherein said pull-down transistor is an N-channel MOS transistor.

13. A CMOS output buffer circuit as claimed in claim 10, wherein said reference voltage generator means (54) includes a voltage divider circuit (56) having its one end connected to a ground potential and its other end connected to the load transistor (P3).

14. A CMOS output buffer circuit as claimed in claim 13, wherein said reference voltage generator means (54) is coupled in a current mirror configuration.

15. A CMOS output buffer circuit as claimed in claim 10, wherein said negative feedback means (54) is comprised of a ground bounce sensing circuit (58) which is formed of a positive half-wave rectifier circuit (60) and a voltage amplifier circuit (62), said positive rectifier circuit (60) having its input connected to the ground potential node and an output, said voltage amplifier circuit having its input connected to the output of said positive rectifier circuit and its output connected to the gate of said load transistor (P3).

16. A CMOS output buffer circuit for providing an output signal at an output node which has significantly reduced voltage oscillation, comprising:

pull-up transistor means (P1) for generating a transition from the low logic level to a high logic level at the output node;

said pull-up transistor means including a P-channel MOS transistor;

pull-down transistor means (P2) for generating a transition from the high logic level to the low logic level at the output node;

said pull-down transistor means including an N-channel MOS transistor;

first negative feedback means (48) for reducing the rate of change of the transient charging current in said pull-up transistor means during the low-to-high transition so as to reduce significantly the voltage oscillation at a power supply potential node;

said first negative feedback means including a supply bounce sensing circuit (48) which is formed of a negative half-wave rectifier circuit (50) and a first voltage amplifier circuit (52), said negative rectifier circuit having its input connected to an internal-power supply node and an output, said voltage amplifier circuit having its input connected to the output of said negative rectifier circuit and its output connected to the gate of a first load transistor (N2); and second negative feedback means (58) for reducing the rate of change of the transient discharging current in said pull-down transistor means during the high-to-low transition so as to significantly reduce the voltage oscillation at a ground potential node.

17. A CMOS output buffer circuit as claimed in claim 16, wherein said second negative feedback means is comprised of a ground bounce sensing circuit (58) which is formed of a positive half-wave rectifier circuit (60) and a second voltage amplifier circuit (62), said positive rectifier circuit (60) having its input connected to the ground potential node and an output, said second voltage amplifier circuit having its input connected to the output of said positive rectifier circuit and its output connected to the gate of a second load transistor (P3).

\* \* \* \* \*